(12) United States Patent
Look et al.

(10) Patent No.: US 6,878,561 B2
(45) Date of Patent: Apr. 12, 2005

(54) MASK-ALIGNMENT DETECTION CIRCUIT IN X AND Y DIRECTIONS

(75) Inventors: Kevin T. Look, Fremont, CA (US); Shih-Cheng Hsueh, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/681,549

(22) Filed: Oct. 7, 2003

(65) Prior Publication Data

US 2004/0072398 A1 Apr. 15, 2004

Related U.S. Application Data

(62) Division of application No. 09/514,041, filed on Feb. 25, 2000, now Pat. No. 6,684,520.

(51) Int. Cl.[7] .............................................. H01L 21/66
(52) U.S. Cl. ............................. 438/14; 438/18; 324/158
(58) Field of Search ...................... 438/14–18; 324/158, 324/693; 33/645

(56) References Cited

U.S. PATENT DOCUMENTS

| | | |
|---|---|---|
| 3,808,527 A | 4/1974 | Thomas |
| 4,384,349 A | 5/1983 | McElroy |
| 4,386,459 A | 6/1983 | Boulin |
| 4,437,760 A | 3/1984 | Ausschnitt |
| 4,571,538 A | 2/1986 | Chow |
| 4,647,850 A | 3/1987 | Henderson et al. |
| 5,093,702 A | 3/1992 | Kim |
| 5,456,018 A | 10/1995 | Irlbeck et al. |
| 5,457,650 A | 10/1995 | Sugiura et al. |
| 5,526,282 A | 6/1996 | Nower et al. |
| 5,543,633 A | 8/1996 | Losavio et al. |
| 5,617,340 A | 4/1997 | Cresswell et al. |
| 5,691,216 A | 11/1997 | Yen et al. |
| 5,699,282 A | 12/1997 | Allen et al. |
| 5,700,732 A | 12/1997 | Jost et al. |
| 5,770,995 A | 6/1998 | Kamiya |
| 5,811,858 A | 9/1998 | Ohkubo |
| 5,925,937 A | 7/1999 | Jost et al. |
| 5,998,226 A | 12/1999 | Chan |
| 6,020,227 A | 2/2000 | Bulucea |
| 6,107,108 A | 8/2000 | Chen et al. |
| 6,127,700 A | 10/2000 | Bulucea |
| 6,137,186 A | 10/2000 | Jost et al. |
| 6,221,681 B1 * | 4/2001 | Sugasawara ................. 438/14 |
| 6,242,757 B1 | 6/2001 | Tzeng et al. |
| 6,305,095 B1 | 10/2001 | Look et al. |
| 6,313,511 B1 | 11/2001 | Noguchi |
| 6,393,714 B1 | 5/2002 | Look et al. |
| 6,436,726 B2 | 8/2002 | Look et al. |
| 6,465,305 B1 | 10/2002 | Look et al. |
| 6,563,320 B1 | 5/2003 | Look et al. |
| 6,647,311 B1 | 11/2003 | Goff |

* cited by examiner

*Primary Examiner*—Dung A. Le
(74) *Attorney, Agent, or Firm*—Arthur Joseph Behiel; Edel M. Young; Lois D. Cartier (57) ABSTRACT

Described are mask-alignment detection structures that measure both the direction and extent of misalignment between layers of an integrated circuit using resistive elements for which resistance varies with misalignment in one dimension. Measurements in accordance with the invention are relatively insensitive to process variations, and the structures using to take these measurements can be formed along with other features on an integrated circuit using standard processes. One embodiment of the invention may be used to measure misalignment between two conductive layers. Other embodiments measure misalignment between diffusion regions and conductors and between diffusion regions and windows through which other diffusion regions are to be formed. A circuit in accordance with one embodiment includes row and column decoders for independently selecting mask-alignment detection structures to reduce the number of test terminals required to implement the detection structures.

7 Claims, 8 Drawing Sheets

MASK-ALIGNMENT DETECTION CIRCUIT IN X AND Y DIRECTIONS

This is a Divisional of application Ser. No. 09/514,041, filed Feb. 25, 2000, now U.S. Pat. No. 6,684,520

FIELD OF THE INVENTION

The invention relates to semiconductor fabrication, and in particular to mask-alignment test structures for measuring the alignment of superimposed elements formed on and within a semiconductor layer.

BACKGROUND

Most semiconductor devices are built up using a number of material layers. Each layer is patterned to add or remove selected portions to form circuit features that will eventually make up a complete integrated circuit. The patterning process, known as photolithography, defines the dimensions of the circuit features.

The goal of the patterning process is to create circuit features in the exact dimensions required by the circuit design and to place them in the proper locations on the surface of a semiconductor wafer. Perfect alignment is an ideal that cannot be achieved in practice. Instead, the various layers of an integrated circuit will be misaligned to some extent. Such misalignment is termed "mask misalignment" because misaligned mask images are the source of the error. When circuits fail during fabrication, it is desirable to determine whether the source of the failure is incorrect mask alignment.

There are a number of conventional methods of detecting mask misalignment. For example, U.S. Pat. No. 5,770,995 to Masayuki Kamiya describes a structure that identifies misalignment between a conductive layer and a contact window layer. The disclosed structure indicates the direction of mask misalignment but does not provide an accurate measure of the extent of misalignment. Each of U.S. Pat. No. 4,386,459 to David Boulin and U.S. Pat. No. 4,571,538 to Pei-Ming Chow describe structures that indicate both the direction and extent of mask misalignment. However, the disclosed structures rely upon process-sensitive circuit parameters to produce accurate misalignment data. For example, misalignment data provided by both the Boulin and Chow structures is sensitive to line-width and resistivity variations. There is therefore a need for a mask-alignment detection structure that accurately indicates the direction and extent of mask misalignment, despite process variations.

The above-mentioned U.S. Patents provide useful background information, and are therefore incorporated herein by reference.

SUMMARY

The present invention satisfies the need for an accurate mask-alignment detection structure that measures both the direction and extent of misalignment between layers of an integrated circuit. Measurements taken using structures in accordance with the invention are relatively insensitive to process variations, and the test structures can be formed along with other features on an integrated circuit using standard processes.

One embodiment of the invention may be used to measure misalignment between a conductive layer and a contact layer. A first conductive layer is patterned to create a number of IC circuit features, including one conductive element for use in mask alignment. An adjacent insulating layer is patterned to create contact windows through which electrical contact is established with the underlying (over overlying) conductive layer. The insulating layer is patterned so that at least one resistive element formed within a contact window only partially overlaps the underlying conductive element. The overlap area, or "contact area," is proportional to the extent to which the contact window is aligned with the conductive element in a first dimension, but is relatively independent of the extent to which the contact window is aligned with the conductive element in a second dimension perpendicular to the first. The resistance of the resistive element varies with contact area, the resistance increasing as the contact area decreases. Thus, the resistance of the resistive element is proportional to the extent of misalignment in the first dimension, and may therefore be used to measure misalignment in that dimension.

In one embodiment, the resistive element is sandwiched between the conductive element and a second conductive element formed from a second conductive layer. The resistance of the resistive element is then measured by forcing a constant current through the resistive element and measuring the resulting voltage drop. (Alternatively, the resistance can be determined by presenting a constant voltage across the resistive element and measuring the resulting current.) The resistance of the resistive element is then converted into an approximation of misalignment between the contact layer and the first conductive layer.

Process variations can affect the resistance of the resistive element, and therefore the validity of the measure of misalignment. Another embodiment of the invention addresses this problem using a second mask-alignment detection structure mirroring the structure described above. The second structure is opposite but otherwise identical to the first. Consequently, misalignment that increases the resistance through the first structure reduces the resistance through the second structure. The misalignment is then calculated using the relationship between the two resistances. One embodiment includes more than one pair of mirror-image detection structures, each exhibiting different degrees of overlap. This embodiment provides additional data points from which to discern misalignment.

The first embodiment of the invention measures the alignment between a conductive layer and a contact layer. Alignment between other types of circuit layers is equally important. Thus, one embodiment of the invention measures misalignment between diffusion regions and conductors, and yet another embodiment measures misalignment between diffusion regions and windows through which other diffusion regions are to be formed. Each embodiment employs variable resistances as a measure of misalignment, and can be formed using conventional processing techniques.

Test structures in accordance with the invention can include many resistive elements, and semiconductor wafers might include many test structures. Unfortunately, the test terminals of these structures collectively occupy a great deal of valuable area. An embodiment of the invention addresses this problem with a test circuit that reduces the requisite number of test terminals using row and column decoders that independently select each resistive element from an array of test structures.

This summary does not purport to define the invention. The invention is defined by the claims.

DETAILED DESCRIPTION

Figure 1A:
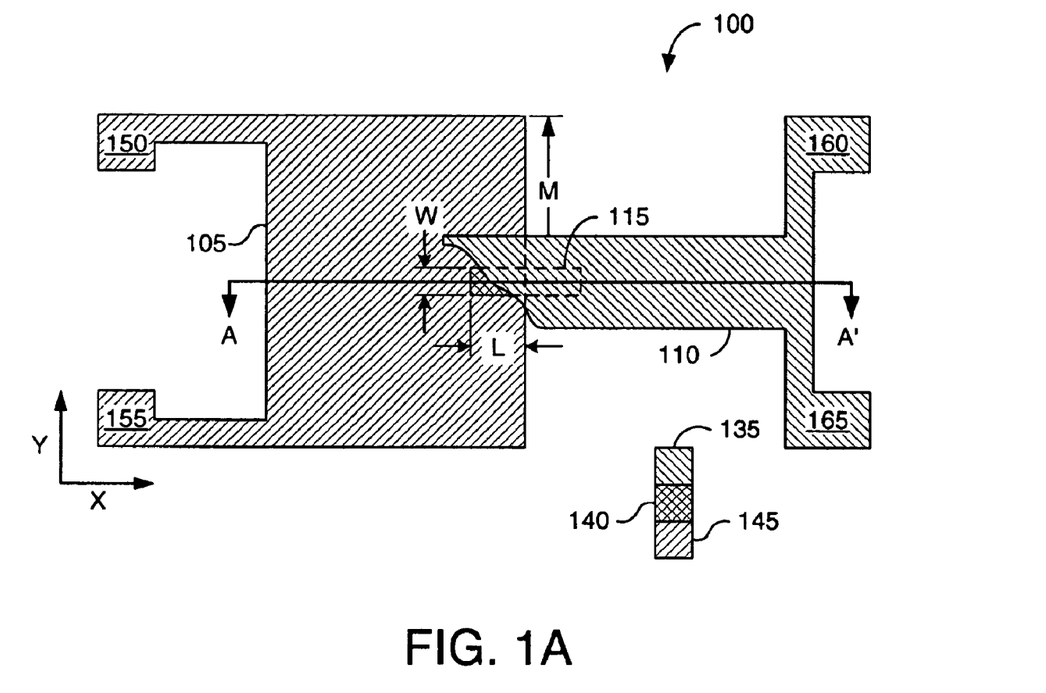
FIG. 1A is a plan view of a mask-alignment structure 100 in accordance with an embodiment of the invention that may be used to measure misalignment between a conductive layer and a contact layer.
Figure 1B:
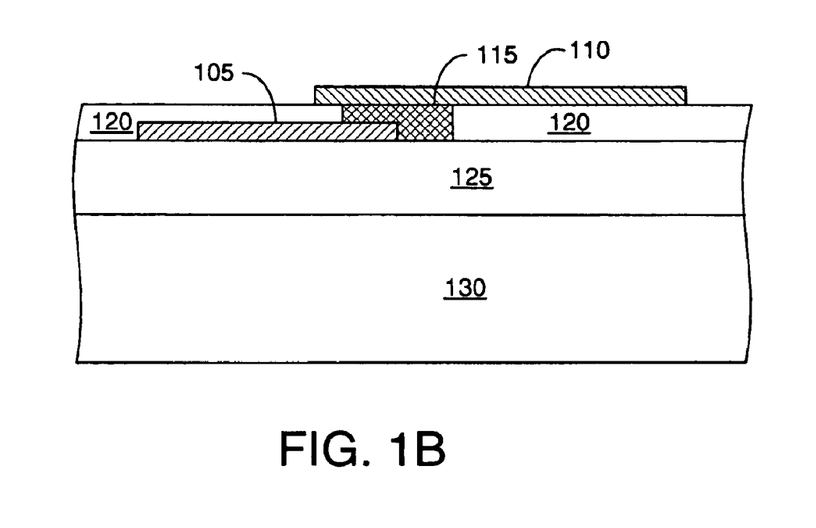
FIG. 1B is a cross-sectional view of structure 100 taken along line A–A' of FIG. 1A.

FIG. 1A is a plan view of a mask-alignment structure 100 in accordance with an embodiment of the invention that may be used to measure misalignment between a conductive layer and a contact layer; FIG. 1B is a cross-sectional view of structure 100 taken along line A–A' of FIG. 1A.

Structure 100 includes a first conductive element 105 electrically connected to a second conductive element 110 via a resistive element 115. Conductive elements 105 and 110 are circuit features patterned from respective metal layers. Resistive element 115 is, in one embodiment, a metal silicide. A contact layer 120, through which resistive element 115 extends, separates conductive elements 105 and 110. Contact layer 120 is an insulator, such as silicon dioxide. Structure 100 is typically formed on a field oxide 125 and a planar semiconductor substrate 130 so that the various layers each extend in a parallel planes having X and Y dimensions. A portion of conductive element 110 is cut away to better illustrate resistive element 115.

Contact layer is patterned so that resistive element 115 partially overlaps underlying conductive element 105. The overlap area, or "contact area," is proportional to the extent to which the contact window is aligned with the conductive element in the X dimension, but is relatively independent of the extent to which resistive element 115 is aligned with conductive element 105 in the Y dimension. The resistance of resistive element 115 varies with contact area, the resistance increasing as the contact area decreases. Thus, the resistance of resistive element 115 can be used to measure misalignment in the X dimension.

Structure 100 includes features 135, 140, and 145. As indicated by cross hatching, features 135, 140, and 145 are portions of the same layers used to form conductive element 110, resistive element 115, and conductive element 105, respectively. Features 135, 140, and 145 are not actual features of the invention, but instead serve to illustrate that the masked used to form the various layers are perfectly aligned in the X dimension. Similar features illustrate the extent of misalignment for layers depicted in other figures.

The area of the overlap between resistive element 115 and conductive element 105 has a contact width W and a contact length L. As long as the mask alignment does not exceed a maximum misalignment tolerance M of structure 100 in the Y dimension, then contact width W remains constant regardless of the degree of misalignment in the Y dimension. Tolerance M is the maximum alignment tolerance, assuming that conductive element 110 is sufficiently aligned with resistive element 115 so that misalignment between conductive element 110 and resistive element 115 does not impact the measurement. There is also a maximum alignment tolerance in the X dimension. In the depicted example, that tolerance is plus or minus L, the contact length: greater misalignments will not alter the resistance of resistive element 115 beyond minimum or maximum values.

Contact length L does not change with misalignment in the Y dimension, but increases or decreases with misalignment in the X dimension. Because the contact area is a product of the contact length L and the contact width W, the contact area is proportional to the extent of misalignment in the X dimension and is independent of the extent of misalignment in the Y dimension.

Conductive element 105 includes a pair of test terminals 150 and 155; conductive element 110 includes a similar pair of test terminals 160 and 165. These test terminals are used to determine the resistance of resistive element 115. The resistance value of resistive element 115 is inversely proportional to the contact area, the resistance increasing as the contact area decreases. Thus, changes in contact area due to misalignment in the X dimension will produce changes in the resistance of resistive element 115. The resistance of resistive element 115 may therefore be used to measure misalignment in the X dimension.

Figure 2:
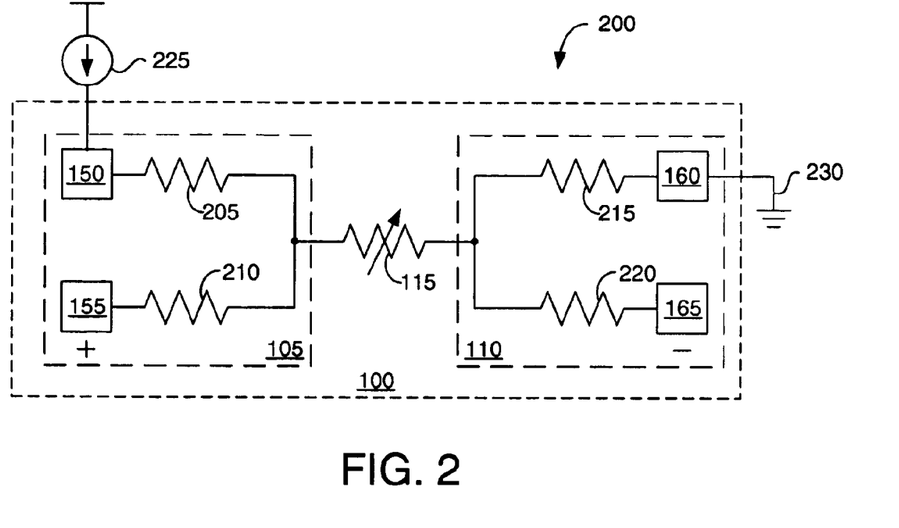
FIG. 2 schematically depicts a test structure 200 that includes structure 100 of FIG. 1.

FIG. 2 schematically depicts a test structure 200 that includes structure 100 of FIG. 1. Various elements of structure 100 are reproduced symbolically and designated using the same reference numbers used to designate them in FIG. 1. For example, resistive element 115 of FIG. 1 is depicted as a resistor 115 in FIG. 2. Resistive element 115 is shown as a variable resistor to emphasize that the resistance of resistive element 115 varies with misalignment, as discussed above.

FIG. 2 depicts conductive element 105 as having a pair of resistors 205 and 210, each extending between one terminal of resistive element 115 and one of respective terminals 150 and 155. Resistors 205 and 210 are symbolic of resistances inherent in conductive element 105. Similarly, conductive element 110 is depicted as having a pair of resistors 215 and 220 that are symbolic of resistances inherent in conductive element 110.

A current source 225 connected to test terminal 150 supplies a fixed current through structure 100 to a power terminal 230, in this case a ground terminal. The fixed current develops a voltage across resistive element 115 that varies with the resistance of resistive element 115, and therefore with the extent of misalignment between conductive element 105 and resistive element 115.

The voltage between terminals 155 and 165 can be converted into an approximation of misalignment between the contact layer and the first conductive layer. However, process variations will affect the values of each resistor within structure 100, and therefore the determination of the extent of misalignment. For example, process variations that affect the thickness and resistivity of resistive element will impact on the resistance of resistive element 115. Unless accounted for, such resistance variations can incorrectly indicate the extent and direction of misalignment.

Figure 3:
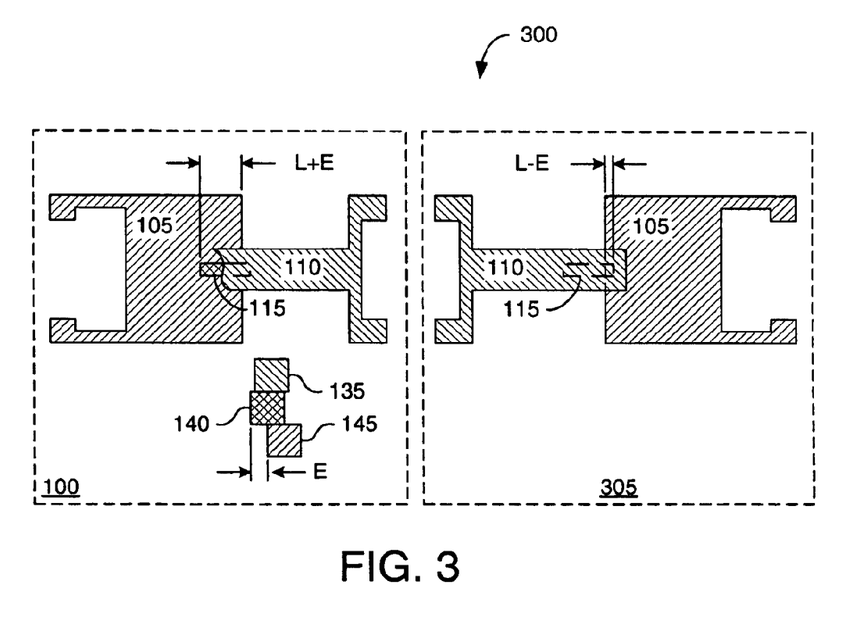
FIG. 3 depicts a mask-alignment measurement structure 300 in accordance with an embodiment of the invention that reduces the impact of process variations on alignment measurements.

FIG. 3 depicts a mask-alignment measurement structure 300 in accordance with an embodiment of the invention that reduces the impact of process variations on alignment measurements. In structure 300, structure 100 of FIG. 1A is mirrored by an opposite but otherwise identical structure 305. Features 135, 140, and 145 here illustrate that each of the layers used to form elements 105, 110, and 115 are misaligned in the X dimension. Specifically of interest, contact layer 120 (FIG. 1B) in which resistive elements 115 is formed is misaligned by an alignment error E with respect to the conductive layer in which elements 105 are formed.

Misalignment error E increases contact length L to L+E in structure 100 and decreases contact length L to L-E in structure 305. Consequently, the resistance through structure 100 is reduced and the resistance through structure 305 is increased. The two resistances can then be used to measure the direction and extent of misalignment error E using methods described below.

Figure 4A:
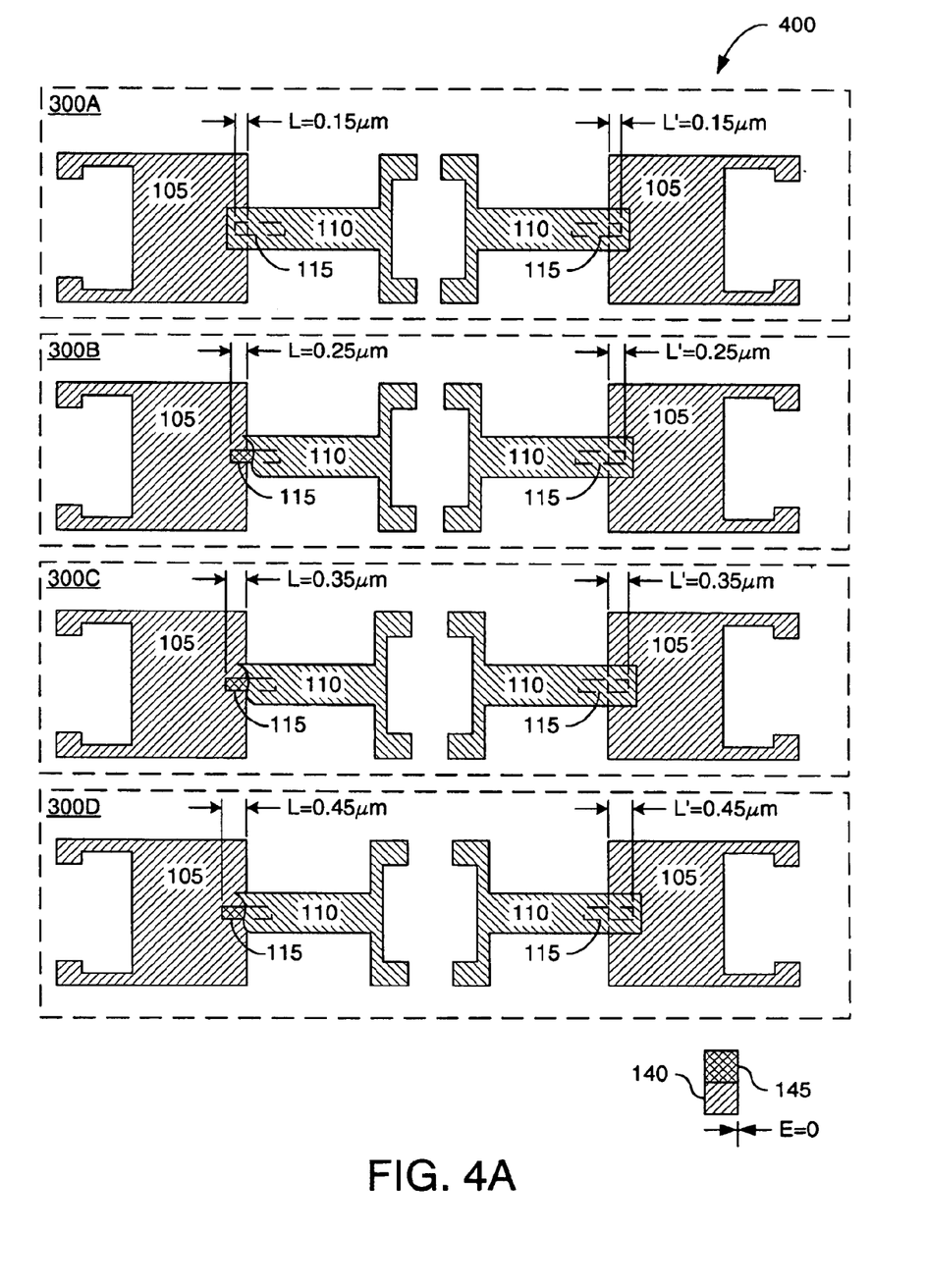
FIG. 4A depicts a mask-alignment measurement structure 400 in accordance with another embodiment of the invention.

FIG. 4A depicts a mask-alignment measurement structure 400 in accordance with another embodiment of the invention. Structure 400 includes a plurality of structures 300A–D, each of which is similar to structure 300 of FIG. 3. In each of structures 300A–D, the contact lengths L and L' of each mirrored pair of resistive elements 115 are the same. For example, each resistive element 115 of structure 300A has an exemplary contact length of 0.15 um. Each subsequent structure 300B–D then includes resistive elements 115 in which the contact length is incrementally increased by 0.1 um. The equivalent contact lengths for each mirrored pair of resistive elements 115 assumes that the layers used to form conductive elements 105 and resistive elements 115 are perfectly aligned, as indicated at the bottom of FIG. 4A using features 140 and 145 (i.e., alignment error E is zero).

Figure 4B:
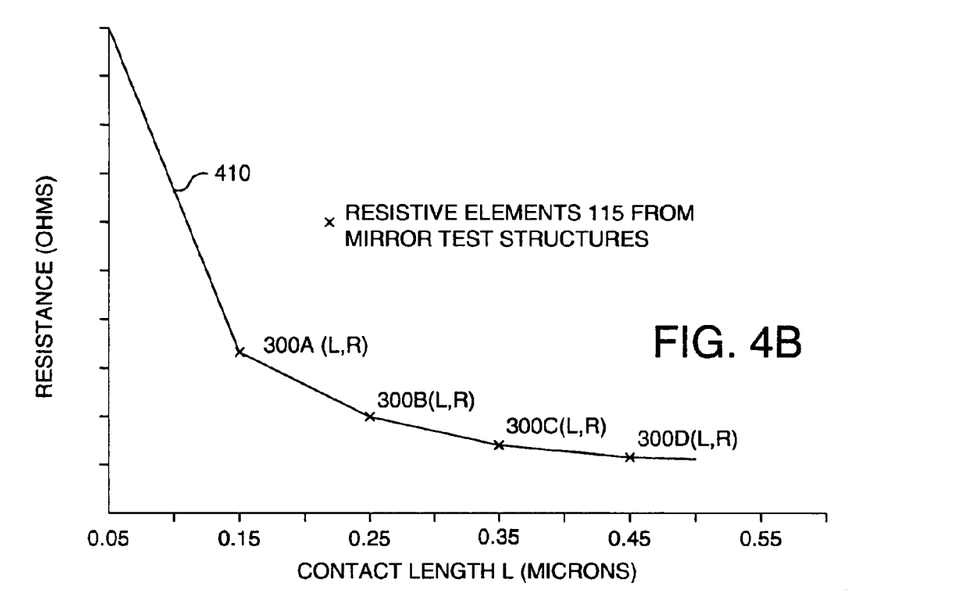
FIG. 4B is a graph depicting the relationship between contact length L and resistance for the various resistive elements 115 of mask-alignment measurement structure 400.

FIG. 4B is a graph depicting the relationship between contact length L and resistance for the various resistive elements 115 of mask-alignment measurement structure 400. In structure 300A, each resistive element 115 has an identical contact length of 0.15 um and therefore identical resistance values. These identical values are plotted on a curve 410 as the first "x" from the left. Likewise, the relative resistances of each successive structure 300A–D are plotted on curve 410. The resistance values are not given because they vary with process variations. However, the shape of curve 410 can be expected to be similar for different processes.

Figure 5A:
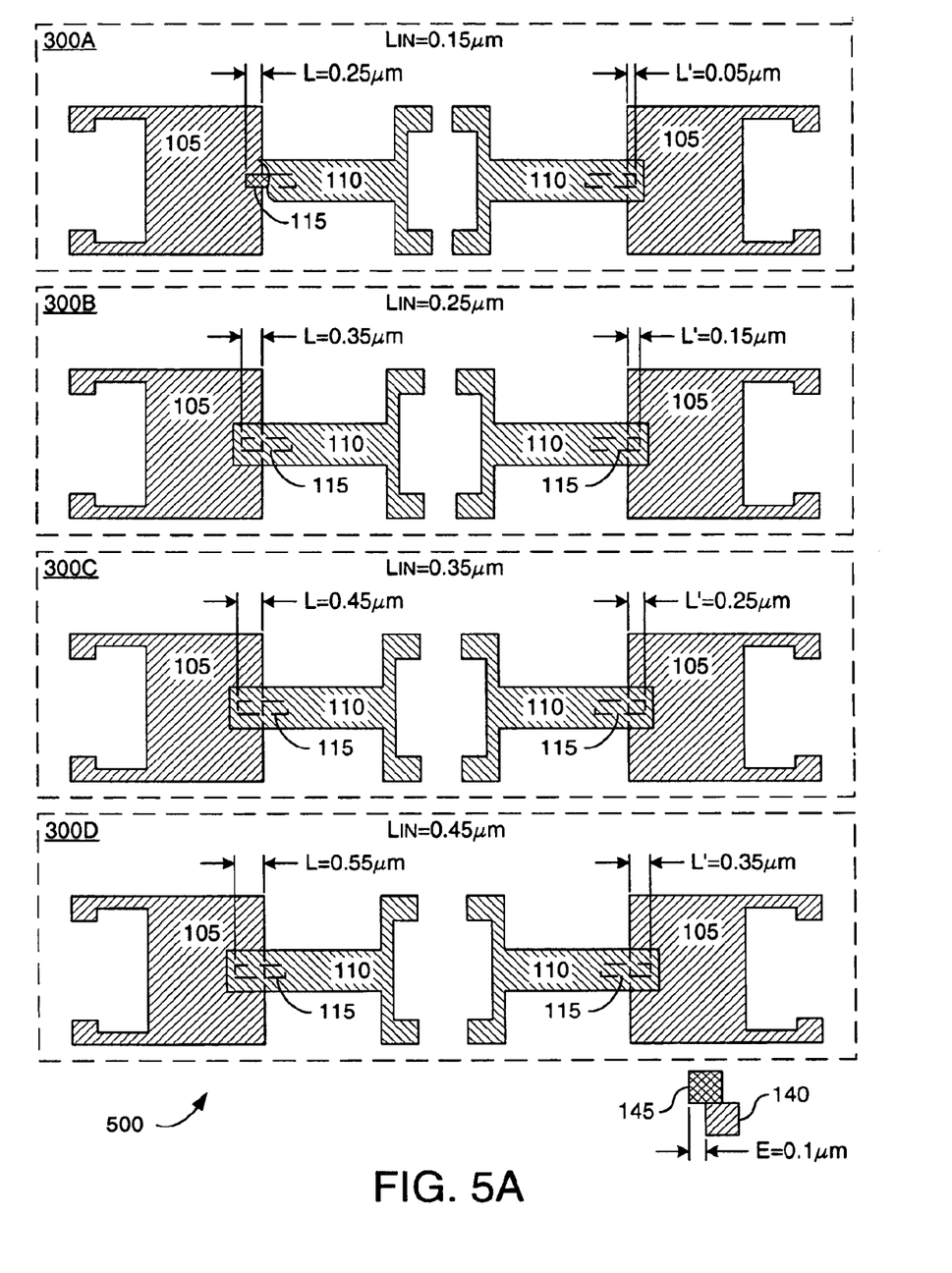
FIG. 5A depicts a mask-alignment measurement structure 500 similar to mask-alignment measurement structure 400 of FIG. 4A.

FIG. 5A depicts a mask-alignment measurement structure 500 similar to mask-alignment measurement structure 400 of FIG. 4A. Structure 500 differs from structure 400 in that contact layer 120 (FIG. 1B)—and therefore resistive elements 115—is misaligned with respect to conductive elements 105 by an alignment error E of 0.1 um in the X dimension. This misalignment shifts each resistive element 115 to the left so that contact length L in each resistive element 115 in the left column of FIG. 4A is increased by 0.1 um and contact length L' in each resistive element 115 in the right column is reduced by 0.1 um. The misalignment is indicated at the bottom of FIG. 5A using features 140 and 145.

For illustrative purposes, the error E is assumed to be 0.1 um. In practice, the error E is not known, but is to be determined. What is known is the "intended" contact length $L_{IN}$ between resistive elements 115 and conductive elements 105, for the intended contact length $L_{IN}$ is specified in the layout used to fabricate structure 400 and the rest of the integrated circuit. The intended overlap lengths for structures 300A–D are depicted in FIG. 4A.

Figure 5B:
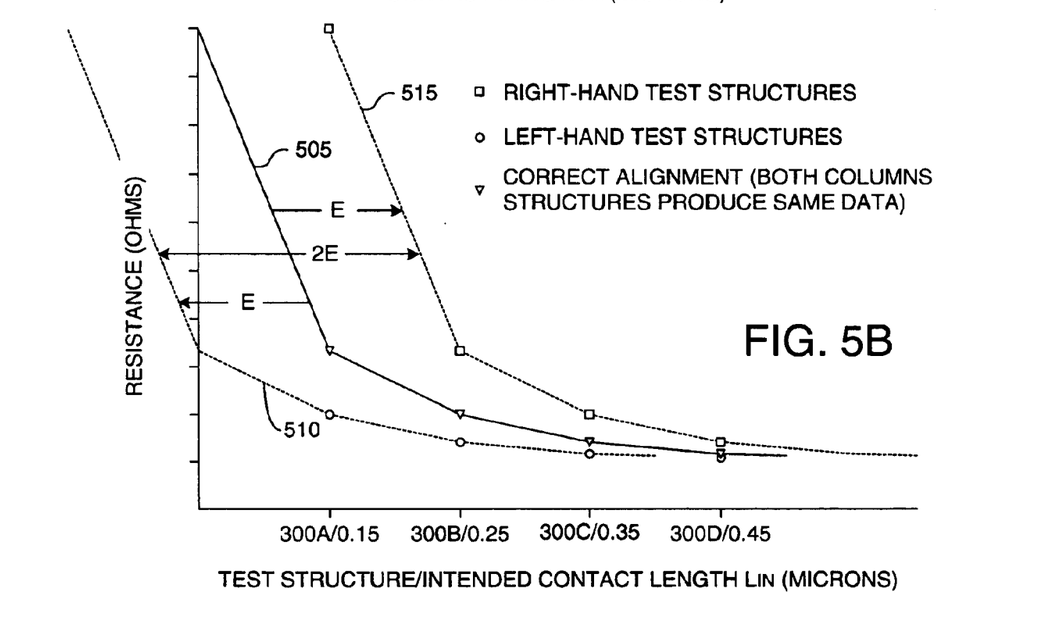
FIG. 5B is a graph depicting the relationship between intended contact length $L_{IN}$ and the measured resistance for the various resistive elements 115 of mask-alignment measurement structure 500 of FIG. 5A.

FIG. 5B is a graph depicting the relationship between intended contact length $L_{IN}$ and the measured resistance for the various resistive elements 115 of mask-alignment measurement structure 500 of FIG. 5A. The graph includes three curves 505, 510, and 515. Curve 505 is the ideal curve taken from FIG. 4B, in which resistive elements 115 and conductive elements 105 were precisely aligned. Circular data points represent resistance data taken from resistive elements 115 selected from the left-hand side of structure 500; square data points represent resistance data taken from resistive elements 115 selected from the right-hand side of structure 500. The resistances of the right-hand resistive elements 115 in structure 300A through 300D are increased and the left-hand resistive elements 115 decreased due to the misalignment. Consequently, curve 510, drawn through the circular data points, is similar to the ideal curve but shifted to the left by 0.1 um, the alignment error E. Curve 510 is extended to illustrate the similarity between curves 510 and 505. Likewise, curve 515, drawn through the square data points and also extended, is similar to ideal curve 505 but shifted to the right 0.1 um. The alignment error E can be calculated by measuring the offset of curves 510 and 515 in the X dimension and dividing the result by two.

The resistance values along curves 515 and 510 change with process variations. However, the spacing between curves 510 and 515 in the X dimension (twice the misalignment error E) is relatively independent of process variations. Thus, structure 400 provides an accurate measure of the extent and direction of misalignment.

The following Table 1 illustrates how hypothetical data obtained using exemplary misaligned structure 500 of FIG. 5A can be used to measure misalignment. Resistances $R_0$ through $R_3$ are hypothetical. The first column, labeled "Error," represents an amount of misalignment between resistive and conductive elements in the X dimension. In this example, the error E is positive when resistive elements 115 is shifted to the left with respect to conductive elements 105.

TABLE 1

| ERROR (um) | SIDE | 300A (0.15) | 300B (0.15 + 0.1) | 300C (0.15 + 0.2) | 300D (0.15 + 0.3) |
|---|---|---|---|---|---|
| E = 0 | L | $R_0$ | $R_1$ | $R_2$ | $R_3$ |
|  | L' | $R_0$ | $R_1$ | $R_2$ | $R_3$ |

TABLE 1-continued

| ERROR (um) | SIDE | 300A (0.15) | 300B (0.15 + 0.1) | 300C (0.15 + 0.2) | 300D (0.15 + 0.3) |
|---|---|---|---|---|---|
| E = 0.1 | L | $R_1$ | $R_2$ | $R_3$ | |
| | L' | | $R_0$ | $R_1$ | $R_2$ |
| E = −0.1 | L | | $R_0$ | $R_1$ | $R_2$ |
| | L' | $R_1$ | $R_2$ | $R_3$ | |

The two rows labeled E=0 show that the resistances corresponding to L and L' (the respective left- and right-side resistive elements 115) are equal for each of structures 300A through 300D. The rows labeled E=0.1 show that for a misalignment of 0.1 um the resistances corresponding the left-side structures decrease and the resistances of the right side increase so that equivalent resistance values are offset by 0.2 um, or 2E. For example, resistance value R1 is associated with the left side of structure 300A and the right side of structure 300C. These structures were designed to have overlaps that differ by 0.2 um; the fact that they exhibit the same resistance indicates resistive elements 115 have shifted 0.1 um with respect to conductive elements 105. The equivalent resistances $R_2$ associated with the left-hand resistive element of structure 300B and the right-hand resistive element of structure 300D indicate the same degree of misalignment. The fact that the left-hand resistive elements exhibit lower resistance than do the right-hand resistive elements indicates that resistive elements 115 are misaligned to the left. Finally, the rows labeled E=−0.1 show that for a misalignment of −0.1 um the resistances corresponding the left-side structures increase and the resistances of the right side decrease so that equivalent resistance values are offset by −0.2 um, or −2E. For example, resistance value R1 is associated with the right side of structure 300A and the left side of structure 300C. The fact that the left-hand resistive elements exhibit higher resistances than do the right-hand resistive elements indicates that resistive elements 115 are misaligned to the right.

The structures and methods described above for measuring the alignment of a contact layer and an underlying conductive layer are easily adapted for use in measuring the alignment of a conductive layer and an underlying contact layer. Referring to FIGS. 1A and 1B, for example, such a measurement could be facilitating by forming conductive element 110 in the lower conductive layer and conductive element 105 in the upper conductive layer. These and other variations will be apparent to those of skill in the art.

Figure 6:
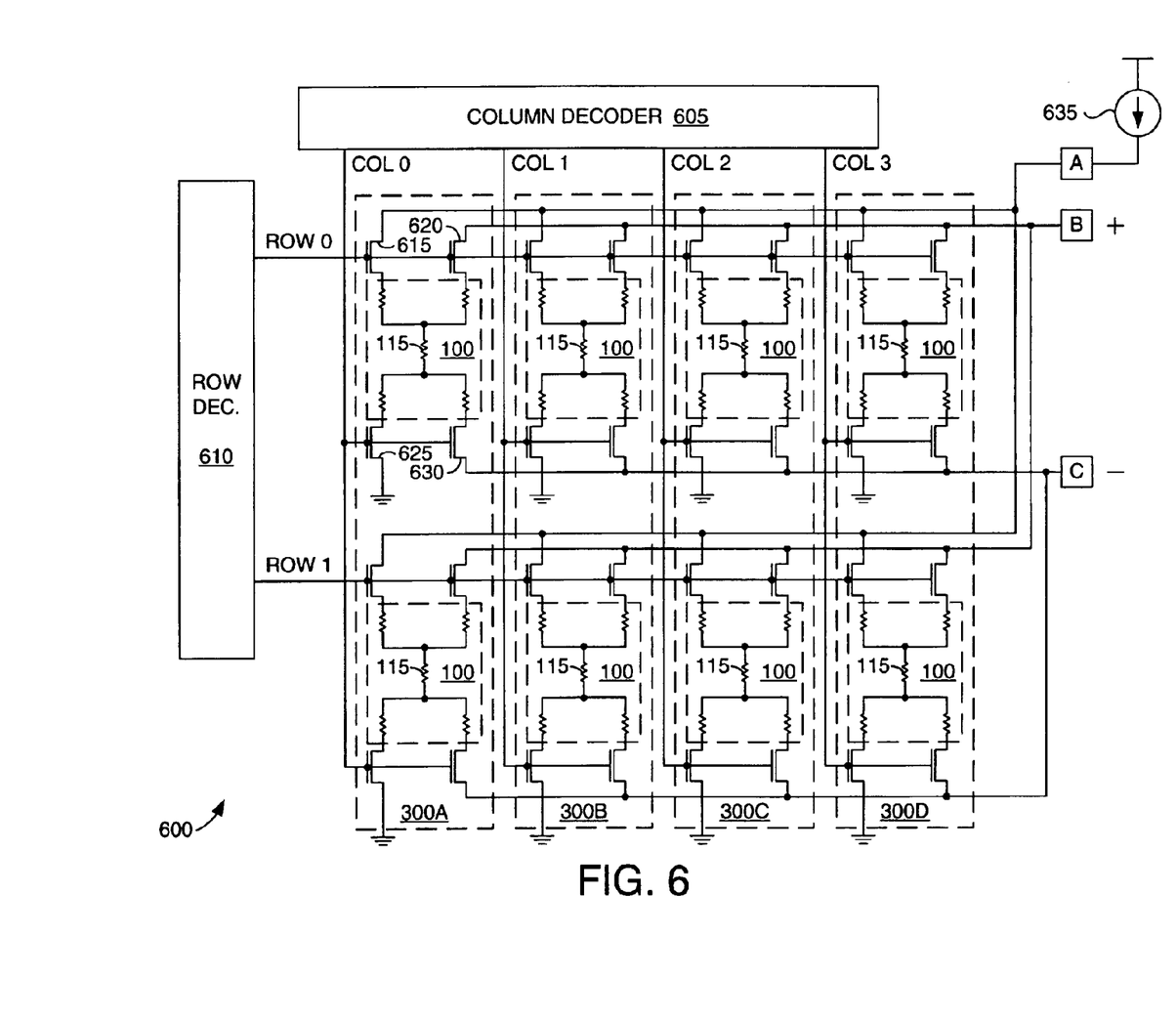
FIG. 6 schematically depicts an integrated circuit 600 that reduces the number of test terminals needed to measure the resistances of an array of mask-alignment test structures.

Structure 500 is illustrated as having four pairs of resistive elements 115. Actual circuit implementations can include many more, and semiconductor wafers might include many such test structures. Unfortunately, the test terminals of these structures occupy a great deal of valuable area. An embodiment of the invention addresses this problem. FIG. 6 schematically depicts an integrated circuit 600 that reduces the number of test terminals needed to measure the resistances of an array of mask-alignment test structures. The depicted embodiment employs an array that includes test structures 300A–D described above in connection with FIGS. 3 through 5B. Test structures 300A–D are arranged in columns that can be independently selected using a column decoder 605. The two test structures 100 within each of test structures 300A–D can be independently selected using a row decoder 610. In combination, column decoder 605 and row decoder 610 can be employed to independently measure the resistance of each resistive element 115 in the manner described in connection with FIG. 2 above.

Referring to the test structure 100 in the upper left-hand corner of circuit 600, two transistors 615 and 620 connect one terminal of resistive element 115 to an output line ROW 0 of row decoder 610 and two transistors 625 and 630 connect the other terminal of resistive element 115 to an output line COL 0 of column decoder 605. Column decoder 605 and row decoder 610 select this restive element (i.e., resistive element 115(0,0)) by driving lines COL 0 and ROW 0 high, turning on transistors 615, 620, 625, and 630. Column decoder 605 and row decoder 610 each only activate one line at a time, so each of the remaining test structures 100 cannot pass current.

Current from a current source 635 passes through the selected resistive element 115(0,0) to ground. The voltage drop across resistive element 115(0,0) is then measured across terminals B and C of circuit 600. This voltage, combined with the current level through source 635, provides a measure of resistance for resistive element 115(0,0). Each of the remaining test structures 100 is similarly selected and measured. Finally, the resulting resistance values are used as discussed in connection with FIG. 5B or Table 1 to determine the extent of misalignment.

Figure 7A:
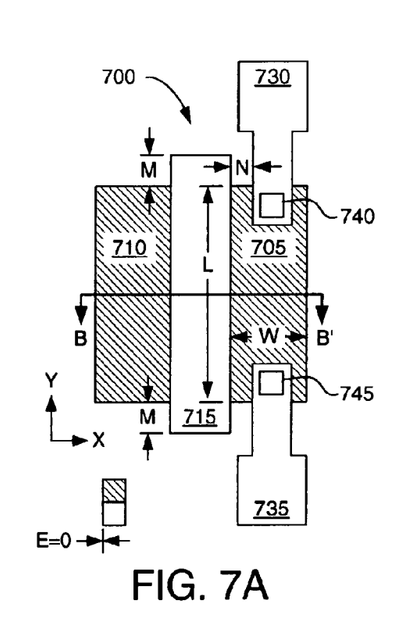
FIG. 7A is a plan view of a mask-alignment detection structure 700 in accordance with another embodiment of the invention.
Figure 7B:
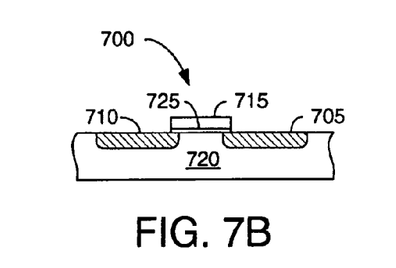
FIG. 7B is a cross sectional view of mask-alignment detection structure 700 taken along line B–B' of FIG. 7A.

FIG. 7A is a plan view of a mask-alignment detection structure 700 in accordance with another embodiment of the invention; FIG. 7B is a cross sectional view of mask-alignment detection structure 700 taken along line B–B' of FIG. 7A. Structure 700 includes a pair of diffusion regions 705 and 710 separated by a conductive element 715, typically polysilicon. Each of these structures is formed on and within a semiconductor layer 720, typically an epitaxial layer of a silicon wafer. Conductive element 715 serves as a mask when diffusion regions 705 and 710 are formed, so that diffusion regions 705 and 710 are self-aligned with edges of conductive element 715. An oxide layer 725 separates conductive element 715 from the underlying layer 720.

A pair of test terminals 730 and 735 connect to diffusion region 705 via a respective pair of contacts 740 and 745. The area of diffusion region 705 is the product of the length L and width W. The resistance of diffusion region 705 is inversely proportional to the width W of diffusion region 705, and the width W depends in turn on the extent to which conductive element 715 and the underlying insulator 725 are aligned in the X dimension with diffusion regions 705 and 710. Conductive element 715 and the underlying oxide 725 extend beyond the upper and lower edges of diffusion 705 by a maximum alignment tolerance M for the Y dimension. The X dimension also has a maximum alignment tolerance N.

Figure 8:
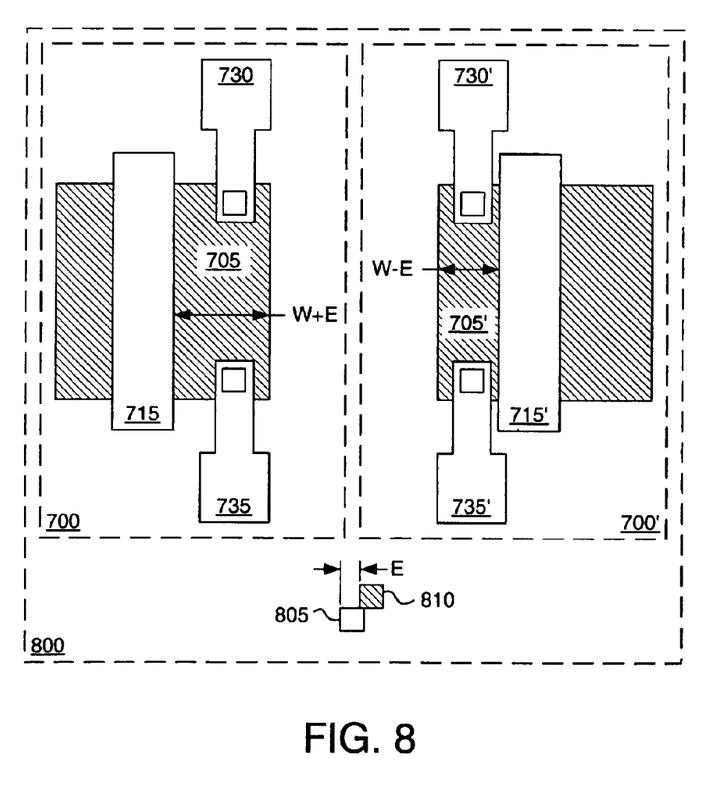
FIG. 8 depicts a mask-alignment measurement structure 800 in accordance with an embodiment of the invention that reduces the impact of process variations on alignment measurements.

Alignment errors in the Y dimension will not affect the resistance of diffusion region 705, provided that such errors do not exceed M. Alignment errors in the X dimension will affect the resistance of diffusion region 705, however, because the area of diffusion region 705 is proportional to the extent to which conductive element 715 is aligned with diffusion region 705 in the X dimension. The resistance between terminals 730 and 735 can therefore be converted into an approximation of misalignment between the conductive element 715 and diffusion region 705. Structure 700 can therefore be used to measure misalignment between a conductive layer and a diffusion region. Process variations will affect the resistance, and therefore the determination of the extent of misalignment. For example, variations in doping levels and diffusion depth both affect resistance. FIG. 8 depicts a mask-alignment measurement structure 800 in accordance with an embodiment of the invention that reduces the impact of process variations on alignment measurements. In structure 800, structure 700 of FIG. 7A is mirrored by an opposite but otherwise identical structure 700'. Features 805 and 810 illustrate that the layer used to form elements 705 and 705' are misaligned from the layer used to form elements 715 and 715' by an amount E in the X dimension.

Misalignment error E increases diffusion width W to W+E in structure 700 and decreases diffusion width W to W−E in structure 700'. Consequently, the resistance through structure 700 is reduced and the resistance through structure 700' is increased. The two resistances can then be used to measure the direction and extent of misalignment error E. Structure 800 can be duplicated using varying widths W and used to measure misalignment in the manner described above in connection with FIG. 5B or Table 1.

In another embodiment, diffusion 710 is compared with diffusion 705 to determine an extent of misalignment. In this embodiment, significant misalignment can create substantial voltage differences between diffusion 705 and diffusion 710. The width of conductive element 715 should therefore be sufficient to keep current from flowing beneath element 715 in response to these potential voltage differences.

Figure 9A:
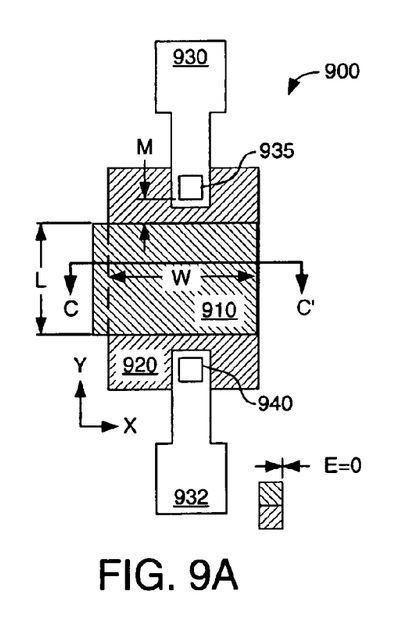
FIG. 9A is a plan view of a mask-alignment detection structure 900 in accordance with another embodiment of the invention.
Figure 9B:
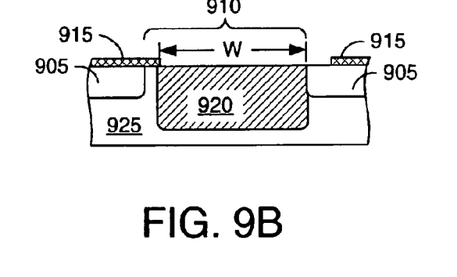
FIG. 9B is a cross-sectional view of structure 900 taken along line C–C' of FIG. 9A.

FIG. 9A is a plan view of a mask-alignment detection structure 900 in accordance with another embodiment of the invention; FIG. 9B is a cross-sectional view of structure 900 taken along line C–C' of FIG. 9A. Structure 900 facilitates misalignment measurements between diffusion regions formed in different process steps and patterned using separate masks. Structure 900 can be used to measure misalignment between masks used to form different diffusion regions. For example, structure 900 can be used to measure the extent of misalignment between a mask used to form active semiconductor regions (e.g., source and drain regions) and well diffusions within which the active regions are formed.

Structure 900 includes a patterned insulating layer 905—typically a field oxide—that serves as a mask to form active diffusion regions (not shown) for other devices on the same die as structure 900. A window 910 in insulating layer 905 might be formed, for example, along with similar windows used to define source and drain regions in a standard CMOS process. Window 910 therefore reflects the active regions.

A mask 915, typically of photoresist, is used to define well diffusions, including a well diffusion 920 that extends through window 910 and into a semiconductor layer 925. Semiconductor layer 925 is typically an epitaxial silicon layer. The width W of the overlap between window 910 and diffusion 920 varies with misalignment between insulating layer 905 and mask 915 in the X dimension, and consequently with misalignment between active diffusions and well diffusions.

A pair of test terminals 930 and 932 connect to diffusion region 920 via a respective pair of contacts 935 and 940. In one embodiment, contacts 935 and 940 are heavily doped diffusions of the same dopant type as diffusion region 920. Referring to the view of FIG. 9B, the cross-sectional area of diffusion region 920 varies with misalignment of oxide layer 905 relative to mask 915; consequently, the resistance between terminals 930 and 932 also varies.

The length L of diffusion region 920 provides a tolerance M in the Y dimension. Window 910 is laid out to overlap the underlying diffusion 920 so that misalignment in one direction in the X dimension reduces resistance and misalignment in the opposite direction increases resistance. Window 910 can be covered by polysilicon and oxide layers (e.g., the gate and gate oxide in a standard CMOS process) to protect the underlying silicon layer 925 from the active diffusions.

Alignment errors in the Y dimension will not significantly affect the resistance between terminals 930 and 932 as long as such errors do not exceed M. Alignment errors in the X dimension will affect this resistance, however. Thus, the resistance between terminals 930 and 932 can be converted into an approximation of misalignment between mask 915 and window 910 in the manner described above in connection with structure 700 of FIGS. 7A and 7B. However, as with structure 700, process variations will affect the resistance, and therefore the determination of the extent of misalignment.

Figure 10:
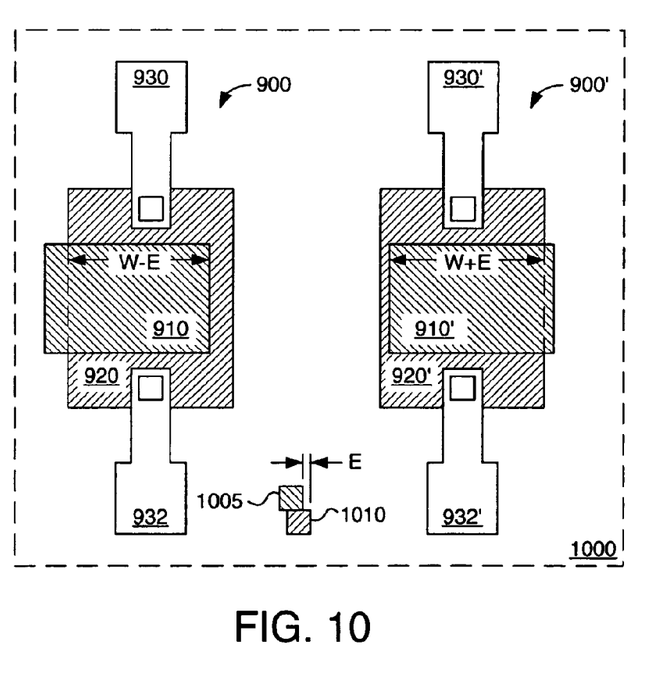
FIG. 10 depicts a mask-alignment measurement structure 1000 in accordance with an embodiment of the invention that reduces the impact of process variations on alignment measurements.

FIG. 10 depicts a mask-alignment measurement structure 1000 in accordance with an embodiment of the invention that reduces the impact of process variations on alignment measurements. In structure 1000, structure 900 of FIGS. 9A and 9B is mirrored by an opposite but otherwise identical structure 900'. Features 1005 and 1010 illustrate that the layer used to form windows 910 and 910' is misaligned with diffusions 920 and 920' by an amount E in the x dimension.

Misalignment error E decreases overlap width W to W−E in structure 900 and increases diffusion width W to W+E in structure 900'. Consequently, the resistance through structure 900 is increased by about the same amount that the resistance through structure 900' is reduced. The two resistances can then be used to measure the direction and extent of misalignment error E. Process variations affect both structures 900 and 900' in substantially the same way. Structure 1000 can be duplicated using varying widths W and used to measure misalignment in the manner described above in connection with FIG. 5B or Table 1.

Each of the above-described structures measures misalignment in one dimension. Similar structures oriented in other dimensions detect misalignment in other directions. Misalignment between layers is typically tested using two sets of test structures aligned along perpendicular axes.

While the present invention has been described in connection with specific embodiments, variations of these embodiments will be obvious to those of ordinary skill in the art. Therefore, the spirit and scope of the appended claims should not be limited to the foregoing description.

What is claimed is:

1. A method of measuring an extent of misalignment between first and second layers of an integrated circuit, the method comprising:

a. patterning first and second circuit features in the first layer;

b. patterning a third circuit feature in the second layer, the third circuit feature designed to extend over the first circuit feature to create a first overlap area, wherein the first overlap area is a first intended overlap when the first and second layers are perfectly aligned in one dimension parallel to the layers, and wherein the first overlap area increases with misalignment in a positive direction along the dimension and decreases with misalignment in a negative direction along the dimension;

c. patterning a fourth circuit feature in the second layer, the fourth circuit feature designed to extend over the first circuit feature to create a second overlap area, wherein the second overlap area is a second intended overlap when the first and second layers are perfectly aligned in the one dimension, and wherein the second overlap area decreases with misalignment in the positive direction and increases with misalignment in the negative direction;

d. measuring a first resistance through the first overlap areas; and e. measuring a second resistance through the second overlap area.

2. The method of claim 1, wherein the first and second intended overlaps are equal.

3. The method of claim 1, further comprising:
   a. patterning the first and second layers to create a first plurality of additional overlap areas each having a unique intended overlap, wherein each of the first plurality of additional overlap areas increases with misalignment in the positive direction and decreases with misalignment in the negative direction;
   b. patterning the first and second layers to create a second plurality of additional overlap areas each having an intended overlap equal to the intended overlap from one of the first plurality of additional overlap areas, wherein each of the second plurality of additional overlap areas decreases with misalignment in the positive direction and increases with misalignment in the negative direction.

4. The method of claim 3, further comprising measuring the resistances of each of the first and second pluralities of additional overlap areas.

5. The method of claim 4, further comprising identifying a third overlap area selected from among the first and second pluralities of additional overlap areas, the third overlap area exhibiting a third resistance equal to the first resistance.

6. The method of claim 5, further comprising subtracting the first intended overlap from the intended overlap of the third overlap area.

7. The method of claim 5, wherein the extent of misalignment is one half the difference between the first intended overlap and the intended overlap of the third overlap area.

* * * * *